United States Patent [19]

Darrow et al.

[11] Patent Number: 4,550,493

[45] Date of Patent: Nov. 5, 1985

[54] APPARATUS FOR CONNECTING CONTACT PINS TO A SUBSTRATE

[75] Inventors: Russell E. Darrow, Endicott; Glenn J. Ingraham, Vestal, both of N.Y.; John D. Larnerd, Owego, N.Y.; Robert W. Nesky, Nicholson, Pa.

[73] Assignee: International Business Machines Corporation, Armonk, N.Y.

[21] Appl. No.: 578,147

[22] Filed: Feb. 8, 1984

[51] Int. Cl.[4] .......... H05K 3/32

[52] U.S. Cl. .......... 29/739; 29/522 A; 29/747; 29/838; 29/845

[58] Field of Search .......... 29/739, 837, 838, 839, 29/844, 845, 747, 509, 522 R, 522 A

[56] References Cited

U.S. PATENT DOCUMENTS

| | | | |
|---|---|---|---|
| 1,900,099 | 3/1933 | Ferguson . | |
| 2,328,821 | 9/1943 | Lyon | 78/49 |
| 3,216,097 | 11/1965 | Stricker et al. | 29/203 |
| 3,257,708 | 6/1966 | Stricker | 29/155.55 |
| 3,557,442 | 1/1971 | Speller | 29/526 |
| 3,735,466 | 5/1973 | Jensen | 29/203 B |
| 3,737,998 | 6/1973 | Byrd | 29/845 |
| 3,768,134 | 10/1973 | Reda et al. | 29/720 |
| 4,110,904 | 9/1978 | Johnson | 29/838 |
| 4,133,096 | 1/1979 | Falcioni | 29/522 A |

*Primary Examiner*—Carl E. Hall
*Attorney, Agent, or Firm*—Frank G. McKenzie; Norman R. Bardales

[57] ABSTRACT

A machine for forming a head and a bulge on a copper pin and to connect the pin to a ceramic substrate by a single application of impact force at high velocity and controlled energy conditions includes an air cylinder within which a piston of controlled mass moves due to the effect of compressed air stored in an accumulator. A die block includes a two dimensional array of holes into which are fitted pin blanks that extend above the surface of the die block and on which is fitted a substrate having an identical array of pin holes formed therein. The pins are fitted within the die block and on the substrate such that a predetermined length of the pin blank extends above the surface of the substrate and a controlled length of the pin blanks extends between the substrate and the die block. The pins are retained within the die against axial movement and the holes in the substrate and die block provide radial restraint to the pins following the application of the impact force. The substrate is elastically supported to deflect after impact while the pin head and bulge are forming.

14 Claims, 4 Drawing Figures

FIG. 2
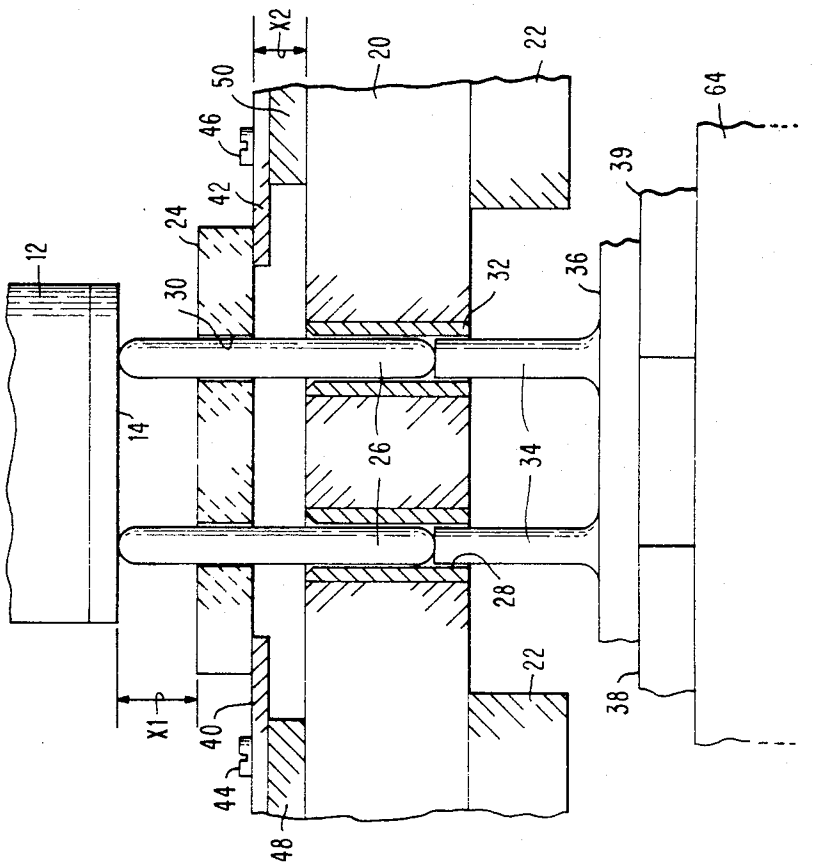
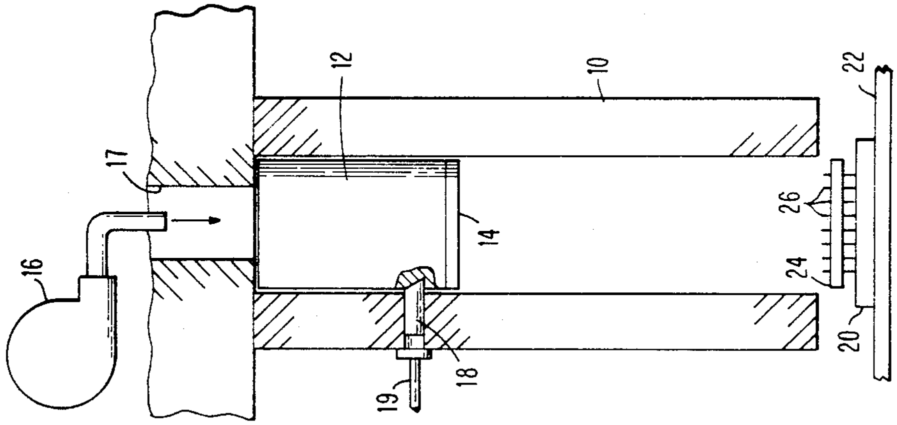
FIG. 1

APPARATUS FOR CONNECTING CONTACT PINS TO A SUBSTRATE

BACKGROUND OF THE INVENTION

1. Field of the Invention

This invention relates to the field of assembly of electronic components and more particularly relates to the connection or fastening of contact pins to a substrate.

2. Description of the Prior Art

Integrated circuit chips are mounted on ceramic bases or substrates, which provide surfaces on which circuit lines are formed that connect the integrated circuit with other portions of the electronic system. The substrates are usually formed by dry molding ceramic material, such as alumina, at high pressure and temperature. Interconnections are made between the circuits of one substrate and the circuits of other substrates by contact pins that are engaged by suitable electronic connectors. The contact pins are generally connected mechanically to the substrates by the application of slowly applied mechanical compression forces, which deform the pin and produce a pin head and collar or bulge between which the substrate is located.

It is difficult to successfully fabricate a satisfactory substrate and contact pin assembly. One difficulty arises because the contact pins must be accurately positioned in the holes of the substrate provided to receive the pins. Furthermore, the ceramic substrate is brittle and easily cracks or chips when subjected to excessive forces, particularly those that produce tension stress, for which the ceramic materials have a well recognized low strength. The contact pins must be rigidly attached to this substrate, free from any movement relative to the substrate and preferably seal the holes in the substrate against the entrance of contaminating materials used at later stages of the fabrication process.

Various techniques and devices have been proposed to attach the pins to the ceramic substrate. As a consequence of the molding process by which the substrates are formed, the substrates have non-planar surfaces and surface irregularities which are more pronounced in substrates of larger size. The presence of these irregular surfaces causes a large percentage of the substrates to crack and fail during the pin fastening operation. For this reason, it has been the conventional practice to mechanically form the pin located in the substrate holes by the application of slowly applied forces that gradually deform the pin material and avoid the abrupt application of forces to the pins during the pinning operation. In the prior art, machines for connecting the pins to the substrate generally employ some elastic component that structurally isolates the substrate from the hard, inflexible surfaces of the dies that apply the compressive force to the pins. The pins are then mechanically deformed by the application of force on the end of the pin which extends above the substrate. However, bending movements are produced in the substrate when the forming force is applied to the pins because the elastic member on which the substrate is supported is pressed against the substrate. Consequently when the forces are applied to the pins, bending moments are produced which induce tensile stresses through the thickness of the substrate and failure of the substrate often results.

SUMMARY OF THE INVENTION

A ceramic substrate, on which an integrated circuit chip is mounted and circuit lines that connect the chip with other portions of the circuit are formed, has an area array of pins mechanically connected by the machine according to this invention. Unformed metallic pin blanks are inserted in holes that extend through the thickness of the substrate. An end of each blank, on which a head is to be formed, extends a controlled distance above the upper surface of the substrate, and a control length of each blank extends between the lower surface of the substrate and the upper surface of a die, in which the other end of the pin blanks is fitted. Anvils contact the end of the blanks that are located within the holes of the die and restrain the blanks against axial displacement.

A pneumatically actuated piston, whose energy and velocity are closely controlled, is accelerated within a cylinder toward the free end of the pin blanks by the application of pressurized gas. The impact force that results when the piston strikes the end of the pin blanks operates to plastically deform the end of the blank to form a head, whose diameter and height is closely controlled, and which contacts the upper surface of the substrate. Another portion of the energy in the piston is used to plastically deform the pin blank in the zone between the upper surface of the die block and the opposite side of the substrate from which the head is formed. In this region the pin is expanded radially outward to form a bulge that contacts the lower surface of the substrate. The head and bulge thereby formed on the pins grip the opposite faces of the substrate between them, and the shanks of the pins engage the substrate holes by radial expansion caused by the impact force.

Normally the abrupt application of tension and bearing forces on a brittle material such as alumina, produces local tensile stress that exceeds the comparatively low tensile strength of the material. Failure of the ceramic is evidenced by cracks that run across the surface of the substrate and through its thickness. However, when the substrate is supported elastically according to this invention and the magnitudes of kinetic energy and impact velocity of the piston are controlled, the pin heads and bulges conform closely to specified limits of height and diameter, and the failure rate of the ceramic substrate is maintained at exceptionally low levels.

According to this invention, a single application of the impact force of a piston on the ends of pin blanks that extend a controlled distance above the surface of the substrate operates to form both a head and a bulge on the pin blanks and to produce a radial outward expansion of the pin into contact with the substrate holes. This expansion seals the space between the outside diameter of the pin shank and the substrate holes so that during later processing of the substrate contaminating materials are prevented from entering the substrate holes.

The foregoing and other objects, features and advantages of the invention will be apparent from the following more particular description of the invention illustrated in the accompanying drawings.

BRIEF DESCRIPTION OF THE DRAWINGS

FIG. 1 is a front elevation view of the general arrangement of a device according to the present invention for connecting contact pins to a substrate.

FIG. 2 is a cross section through a portion of the pinning device of FIG. 1 that shows the relative positions of the substrate, contact pins, die block, substrate support and piston head.

DESCRIPTION OF THE PREFERRED EMBODIMENT

Figure 3A:
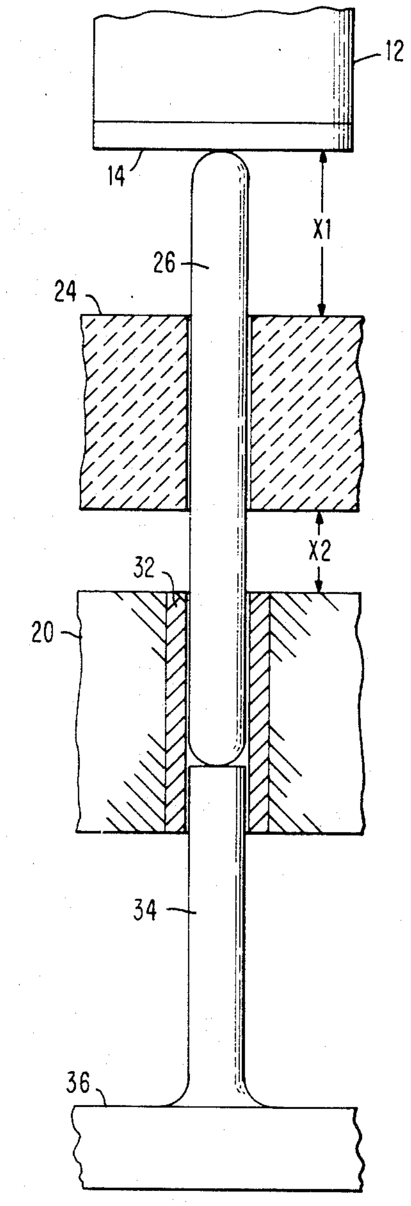
FIGS. 3A and 3B show the formation of the pin head and bulge in the pinning device according to this invention.

Referring first to FIG. 1, the principle components of the device according to this invention for controlling the impact velocity and impact energy include a cylinder 10 and a piston 12, which is adapted to move within the cylinder on an air bearing or other means for minimizing frictional contact between the piston and the cylinder. The body of the piston is formed of an impact tolerant plastic material such as Vespel and the piston has a hardened steel face plate 14. The upper end of the cylinder communicates with the discharge side of an air compressor 16, air pump or another device capable of producing a supply of compressed gas. An accumulator 17, a container located between the discharge side of the air pump and the cylinder, maintains a nearly uniform pressure in the cylinder while the piston is moving toward impact on the pin blanks because its volume is large in comparison with the volume of the cylinder. The piston is retained in the elevated position shown in FIG. 1 by a latch mechanism 18 whose engagement with the piston is maintained by air pressure supplied to the latch mechanism through duct 19. When the force exerted by the piston on the latch member exceeds the resisting force developed by air pressure on the latch mechanism, the piston is released and accelerates within the cylinder toward a substrate assembly located at the lower end of the cylinder. A die block 20 having an area array of pin holes formed through its thickness rests on a support bench or table 22. A ceramic substrate 24 having a similar and complementary array of holes formed through its thickness is located so that the pin blanks 26 extend through the substrate thereby exposing a portion of the length of each pin blank immediately below the piston.

Referring now to FIG. 2, two of the pin blanks 26 of a larger number of pin blanks arranged in a two dimensional array are shown located such that a first portion of each pin is located within the holes 28 of the die block 20. These holes are aligned with the area array of holes formed in the workpiece or substrate 24. Holes 28 of the die block are fitted with carbide bushings 32, which protect the surfaces of the die block holes against gouges and deformations that can result during the pinning process and in handling the parts.

Anvil members 34, fitted within the bushed holes of the die block, have end faces that contact the lower ends of the pin blanks at one end and are formed either integrally with extractor plate 36 or contact the upper surface of plate 36, which is movable parallel to the axis of the pin blanks yet is fixed against axial movement during the pinning process. The location of the extractor plate above the surface of bed 64 is controlled within a close tolerance by shims 38, 39 located between the lower surface of the extractor plate and the upper surface of the bed. The thickness of shims 38 and 39 control the dimension, which is the length of X1 the pin blank that extends above the upper surface of the workpiece 24.

The substrate or workpiece, a rectangular or square panel perhaps 36 millimeters on a edge and two millimeters thick, is formed in a press at high pressure from a mixture of 97 percent alumina and three percent binder material. The holes of the workpiece and of the die block are spaced one from another in a direction parallel to the edges of the workpiece a distance of approximately 2.5 millimeters. The diameter of the pin holes in the substrate is 0.572 millimeters.

The pins, made from Amzirc a product of GTE Corporation comprising oxygen free copper and approximately 1 percent zirconium, have a nominal diameter of 0.0202 inches, a positive tolerance of 0.0002 inches and a negative tolerance of 0.0003 inches. The bushings 32, fitted within the die block 20 with a light interference fit, have an inside diameter of 0.0208 inches, a positive tolerance of 0.0002 inches and a negative tolerance of 0.0 inches.

Spring strips 40, 42 overlap by approximately 0.010 inches the lower surface of substrate 24 and provide resilient support to the substrate during the pinning process. The spring strips are made of spring steel approximately 5 to 10 thousandths of an inch thick and 0.85 inches wide and are fixed in position and retained by screws whose centers are 0.923 inches from the edge of the spring strips. The spring strips are supported in part by shims 48, 50 that rest on the upper surface of the die block and contact the lower surface of the spring strips. Screws 44, 46 retain the shims in position so that the distance between the center line of the screws to the edge of the shims under the strips is approximately 0.060 inches. Shims 48, 50 are approximately the same width as the spring members but the thickness of shims 48,50 is selected so that dimension X2 is controlled to a close tolerance. Dimension X2 is approximately 0.020 inches and dimension X1, which is determined by the selected thickness of shims 38, 39 and the position of the upper surface of bed 64 relative to plate 36 is approximately 0.044 inches.

Figure 3B:
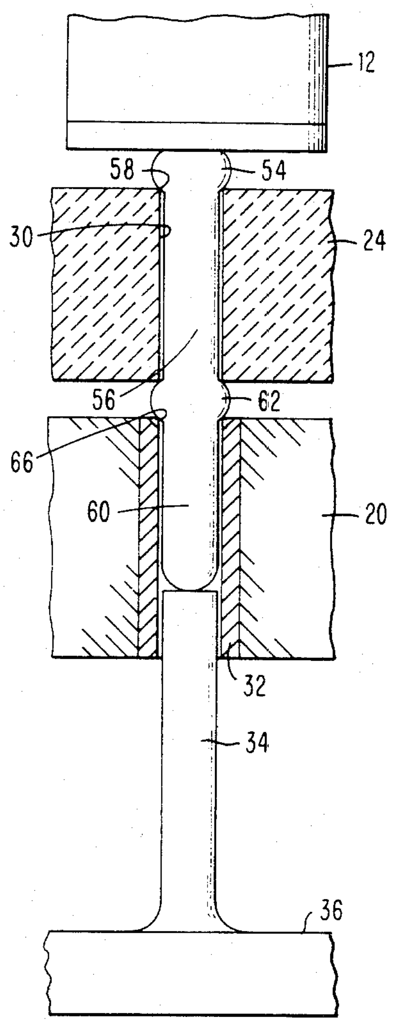

The process of forming the head and bulge on the pin is best demonstrated with reference to FIGS. 3A and 3B. When the compressed air is admitted to the upper end of the piston and the retaining force of the latch members is overcome, the piston accelerates downward into contact with the upper end of the pins 26. A major portion of the energy of the piston is converted to strain energy and operates to deform the shank of the pin in the region of dimension X1. A pin head 54 is formed whose diameter and height are controlled by the various parameters of the pinning process, such as the impact velocity of the piston, the energy of the piston, dimension X1, etc. Following impact, the head, whose diameter is greater than that of the pink shank, is formed so that the head of the pin moves outward toward the surface of the substrate hole and into contact at 58 with the surface of the substrate hole 30, thereby sealing the upper end of the annulus located between the substrate and the pin shank 56. A portion of the kinetic energy of the piston causes radial expansion of the pin blank portion 60 located within the die block hole, thereby causing the pin surface to expand outward toward the inside diameter of bushings 32.

Next, after head 54 is formed, the substrate moves downward against the light resilient elastic support of springs 40, 42 and a bulge portion 62 begins to form over the length of the shank in the region defined and controlled by dimension X2. Dimension X2 is maintained short enough so that columnar buckling of the pin is avoided and the height of the bulge as well as its diameter are controlled to close tolerances. When the bulge is formed, its radial expansion causes it to contact the lower edge of the holes 30 of the workpiece, thereby sealing at 66 the lower surface of the annular space located between the surface of the pin and the hole surface of the workpiece.

The device according to this invention has been used successfully where the area of the face of the piston is 2.22 square inches; the volume of the accumulator 17 is 246.3 cubic inches; the weight of the piston is 0.20 pounds and the distance from the upper end of the pin blanks to the face of the piston when the piston is in the latched position at the upper end of the cylinder, is 4.132 inches. In using this pinning device, the pressure of the accumulator was permitted to vary between 23 and 28 pounds per square inch (gauge). Because the volume of the accumulator is large in relation to the volume of the cylinder, the pressure in the accumulator is assumed to change very little due to the movement of the piston within the cylinder from the latched position to the impact position on the ends of the pin blanks. Under these conditions and with these values, it has been determined that the velocity of the piston at the point of impact is approximately 900 inches per second when the accumulator pressure is 23 psi. and is approximately 1012 inches per second when the accumulator pressure is 29 psi. The corresponding impact energy of the piston is 3672 inch-pounds per square inch of pin blank cross sectional area when the accumulator pressure is 23 psi. and the impact energy is approximately 4632 inch-pounds per square inch of pin blank cross sectional area when the accumulator pressure is 29 psi. The cross sectional area of the pin blanks is the sum of the cross sectional areas of each of the pin blanks with which the piston makes contact. When the accumulator pressure is 15 psi. (gauge) the speed of the piston at the time of impact is approximately 726 inches per second and the energy of the piston is approximately 2390 inch-pounds per square inch of pin blank cross sectional area. The weight of the piston and its face area were selected for use in pinning 212 pins each having the nominal pin diameter.

Although the invention has been shown and described with reference to the preferred embodiment, it will be understood by those skilled in the art that changes in the values of the parameters can be altered to accommodate the size of the pins and the number of pins to be joined to the ceramic substrate without departing from the spirit and scope of the invention.

We claim:

1. A device for forming a head and bulge on a predetermined end and an inner portion, respectively, of at least one elongated pin blank, each said blank being located in a mutually exclusive pin receiving hole of a workpiece and extending outwardly from first and second surfaces of said workpiece, said device connecting each said blank to said workpiece in each said hole between said head and bulge thereof, said device comprising:

a die block having a third surface and an opening aligned with each said hole of said workpiece, each said opening extending inwardly from said third surface and receiving therein the other end of a said blank, said third surface being spaced from said second surface of said workpiece, means for restraining each said pin blank against axial movement;

spring means for resiliently supporting said workpiece adjacent said third surface of said die block;

first locating means for controlling a first distance extending between said first surface of said workpiece and said predetermined end of each said pin blank to provide a first predetermined length of each said blank therebetween;

second locating means for controlling a second distance extending between said second surface of said workpiece and said third surface of said die block to provide a second predetermined length of each of said blank therebetween; and means for striking said predetermined end of each said pin blank at high speed with a predetermined energy to form said head and said bulge with said first and second lengths, respectively, of each said blank.

2. A device according to claim 1 wherein said means for striking strikes each said predetermined end with the one and same impact.

3. A device according to claim 1 wherein said workpiece is a ceramic substrate and each said pin blank is conductive.

4. The device of claim 1, wherein said means for striking includes:

a source of pressurized fluid able to deliver fluid at a predetermined pressure;

a cylinder connected to said source; and a piston movable within said cylinder in response to the pressure within said cylinder.

5. The device of claim 4 wherein said means for striking further includes an accumulator defining a volume substantially larger than the volume of said cylinder, said accumulator being located between the outlet side of said source and said cylinder for regulating the pressure within said cylinder.

6. A device for forming and controlling the size of a head and bulge formed thereby on a pin blank located in a pin receiving hole of a workpiece and extending outwardly from first and second of said workpiece, said device connecting said pin blank in said hole to said workpiece between said head and bulge thereof, said device comprising:

a die block having an opening aligned with said pin hole of said workpiece, each said opening extending inwardly from a first surface of said die block and receiving a first portion of said pin blank therein, said first surface of said die block being spaced from said second surface of said workpiece and from which a second portion of said pin blank extends away from said die block;

an anvil member contacting the end of said pin blank located within said die block opening for fixing said blank against axial movement;

spring means for resiliently supporting said workpiece with said second surface thereof adjacent said first surface of said die block;

first means for controlling a first distance between said first surface of said workpiece and the other end of said pin blank to provide a first predetermined length of said blank therebetween, second means for controlling a second distance between said second surface of said workpiece and said first surface of said die block to provide a second predetermined length of said blank therebetween;

piston means for striking said other end of said pin blank at high speed with a single impact to form said head and bulge with said first and second lengths, respectively, of said blank; and means for controlling the magnitude of the kinetic energy of said piston means at which said piston means strikes said pin blank and the speed at which said piston means strikes said pin blank.

7. A device according to claim 6 wherein said workpiece is a ceramic substrate and said pin blank is conductive.

8. The device of claim 6 wherein said spring means comprises two thin spring strips each having a free end supporting an edge of said workpiece at opposite sides of said workpiece, and means for supporting each said strip against displacement, whereby said workpiece is axially supported resiliently by bending of said strips due to the effect of the striking force of said piston means on said pin blank.

9. The device of claim 8 wherein said means for supporting is a shim located between said first surface of said die block and said spring means; and wherein said second means for controlling said second distance comprises said shim and said strips, the thickness of said shim and of said spring strips defining and controlling said second distance between said second surface of said workpiece and said first surface of said die block.

10. The device of claim 9 wherein said second distance between said second surface of said workpiece and said first surface of said die block is equal to or greater than the axial displacement of said workpiece due to the effect of the striking force of said piston means on said pin blank.

11. The device of claim 8 further comprising an extractor plate fixed against axial displacement and axially movable, said plate providing a support surface on which each said anvil member rests.

12. The device of claim 6 wherein said means for controlling said first distance is shim means located between said first surface of said die block and said spring means that support said workpiece.

13. The device of claim 6 wherein said means for controlling the magnitude of the kinetic energy and speed includes:

a source of pressurized fluid able to deliver fluid at a predetermined pressure;

a cylinder connected to said source; and a piston movable within said cylinder in response to the pressure within said cylinder, said piston means comprising said piston.

14. The device of claim 13 wherein said means for controlling the magnitude of the kinetic energy and speed of said piston means further includes an accumulator defining a volume substantially larger than the volume of said cylinder located between the outlet side of said source and said cylinder, said accumulator regulating the pressure within said cylinder.

* * * * *